United States Patent [19]
Wan et al.

[11] Patent Number: 5,523,241
[45] Date of Patent: Jun. 4, 1996

[54] METHOD OF MAKING INFRARED DETECTOR WITH CHANNEL STOPS

[75] Inventors: Chang-Feng Wan, Garland; Joseph D. Luttmer, Richardson; Julie S. England; David E. Fleming, both of Dallas, all of Tex.

[73] Assignee: Texas Instruments Incorporated, Dallas, Tex.

[21] Appl. No.: 361,902

[22] Filed: Dec. 21, 1994

Related U.S. Application Data

[60] Continuation of Ser. No. 69,261, May 28, 1993, abandoned, which is a division of Ser. No. 517,919, May 2, 1990, abandoned, which is a continuation-in-part of Ser. No. 403,536, Sep. 6, 1989, abandoned.

[51] Int. Cl.⁶ ........................................... H01L 21/8254
[52] U.S. Cl. ................... 437/22; 437/5; 437/185; 148/DIG. 63
[58] Field of Search ................ 437/3, 5, 22, 70, 437/155, 185, 954, 978; 148/DIG. 34, DIG. 43, DIG. 44, DIG. 63, DIG. 64, DIG. 80, DIG. 84; 257/442, 614

[56] References Cited

U.S. PATENT DOCUMENTS

| | | | |
|---|---|---|---|
| 3,799,803 | 3/1974 | Kraus et al. | 148/DIG. 64 |
| 4,149,904 | 4/1979 | Jones | 437/41 |
| 4,206,003 | 6/1980 | Koehler | 437/185 |
| 4,223,334 | 9/1980 | Gasner et al. | 257/374 |
| 4,261,763 | 4/1981 | Kumar et al. | 437/70 |
| 4,513,303 | 4/1985 | Abbas et al. | 257/327 |
| 4,624,046 | 11/1986 | Shideler et al. | 437/70 |
| 4,632,886 | 12/1986 | Teherani et al. | 257/614 |
| 4,638,345 | 1/1987 | Elabd et al. | 257/451 |
| 4,654,686 | 3/1987 | Borello | 257/442 |
| 4,684,812 | 8/1987 | Tew et al. | 257/442 |
| 4,753,896 | 6/1988 | Matloubian | 437/45 |
| 4,766,084 | 8/1988 | Bory et al. | 437/3 |
| 5,043,293 | 8/1991 | Kinch et al. | 437/185 |

FOREIGN PATENT DOCUMENTS 63-293850 11/1988 Japan ........................ 437/70

OTHER PUBLICATIONS

Chu et al., "High-Performance backside-illuminated $Hg_{0.78}Cd_{0.22}Te/CdTe(\lambda_{co}=10$ μm)planar diodes", Appl. Phys. Lett. 37(5), Sep. 1, 1980, pp. 486–488.

Bauer et al., "Properties of Silicon Implanted with Boron Ions Through Thermal Silicon", Solid State Elec., vol. 16, 1973, pp. 289–300.

*Primary Examiner*—Chandra Chaudhari
*Attorney, Agent, or Firm*—Ira S. Matsil; James C. Kesterson; Richard L. Donaldson

[57] ABSTRACT

Channel stops for MIS infrared photodetector devices in $Hg_{1-x}Cd_xTe$ by lattice damage (454) between and automatically aligned to MIS gates (408). Also, field plates and guard rings are automatically aligned to MIS gates.

14 Claims, 8 Drawing Sheets

METHOD OF MAKING INFRARED DETECTOR WITH CHANNEL STOPS

CROSS-REFERENCE TO RELATED APPLICATIONS

This application is a Continuation of application Ser. No. 08/069,261 now abandoned, filed May 28, 1993 which is a divisional of Ser. No. 07/517,919 filed May 2, 1990 (now abandoned) which is a continuation in-part of Ser. No. 07/403,536 filed Sep. 6, 1989 (abandoned). U.S. application Ser. No. 769,993, now U.S. Pat. No. 5,043,293, filed Aug. 26, 1985, (Kinch and Simmons) discloses related subject matter. These cross-referenced applications are assigned to the assignee of this application.

BACKGROUND OF THE INVENTION

1. Field of the Invention

The present invention relates to infrared radiation detectors and, more particularly, to small bandgap semiconductor infrared detectors and methods of fabrication.

2. Description of the Related Art

Detection of infrared radiation emitted by warm bodies provides an important method for night vision (perception without visible light). Infrared detectors are of various types and include small bandgap semiconductors structured as photodiodes or photocapacitors. Alloys of mercury telluride and cadmium telluride, generically denoted $Hg_{1-x}Cd_xTe$, are extensively employed as the photosensitive semiconductor in such detectors. Indeed, $Hg_{0.8}Cd_{0.2}Te$ has a bandgap of about 0.1 eV which corresponds to a photon wavelength of 12 µm and $Hg_{0.73}Cd_{0.27}Te$ has a bandgap of about 0.24 eV corresponding to a photon wavelength of 5 µm; and these two wavelengths are in the two atmospheric windows of greatest interest for infrared detectors.

An infrared imager incorporating an array of MIS photocapacitor detectors in $Hg_{1-x}Cd_xTe$ is disclosed in U.S. Pat. No. 4,684,812 (Tew and Lewis). FIGS. 1a–b are cross sectional elevation and plan views of a single photocapacitor and illustrate the anodic oxide passivation of the $Hg_{1-x}Cd_xTe$. Anodic oxidation of $Hg_{1-x}Cd_xTe$ provides a passivation layer made of primarily $HgTeO_3$, $CdTeO_3$, and $TeO_2$ on the surface of the $Hg_{1-x}Cd_xTe$ (typically the layer is grown to a thickness of 700 Å), and this oxide passivation layer typically includes substantial trapped positive charge with density of roughly $1\times10^{12}/cm^2$. The trapped charge acts as a channel stop in that it accumulates electrons at the oxide $Hg_{1-x}Cd_xTe$ interface and deters inversion in n type $Hg_{1-x}Cd_xTe$. This achieves maximum usable potential well capacity and integration time.

However, the anodic oxide passivation layer is thermodynamically unstable and sulfide passivation layers (primarily CdS plus some HgS) are replacing oxide passivation layers; see U.S. Pat. No. 4,632,886 (Teherani and Simmons). Sulfide passivation layers have the drawback of not incorporating substantial positive fixed charger, and various approaches have been used to control surface currents. One approach is to etch away the sulfide passivation layer in channel stop areas and grow anodic oxide to regain the fixed positive charge, but this has the problem of extra wet processing steps. Alternatively, a field plate may be incorporated into the imager and biased to induce a channel stop, but this has the problems of a more complicated structure and processing sequence.

Infrared detectors based on photodiodes in $Hg_{1-x}Cd_xTe$ require formation of p-n junctions in $Hg_{1-x}Cd_xTe$, and such junctions are frequently made by ion implanting species such as boron into p type $Hg_{1-x}Cd_xTe$. Prior to annealing, the implanted region has strong n type doping even for very small implanted doses of each kind of implanted ion (donor, acceptor, inert) and the carrier concentration increases with implant dose but rapidly reaches a saturation in sheet donor concentration of $2\times10^{14}/cm^2$. See, G. Destefanis, 86 J.Crystal Growth 700 (1988) at 705.

SUMMARY OF THE INVENTION

The present invention provides optimal methods of implementing channel stops in $Hg_{1-x}Cd_xTe$ and related compounds by ion implants, ion milling, or field plate formation. In preferred embodiments, a gate photoresist pattern is undercut using an isotropic etch of the gate material to leave a buffer area between the gate and adjacent channel stop locations, then with the photoresist still in place either (1) boron is implanted through sulfide (CdS, HgS) passivation and/or ZnS dielectric on $Hg_{1-x}Cd_xTe$ or (2) field plate metal is deposited and lifted-off using the photoresist to form channel stops aligned to the gate without additional patterning steps. This solves the problems of the known methods of channel stop formation with non-anodic oxide passivation.

BRIEF DESCRIPTION OF THE DRAWINGS

The drawings are schematic for clarity.

FIGS. 8a–c show steps in a second preferred embodiment method.

DESCRIPTION OF THE PREFERRED EMBODIMENTS

Figure 1A:
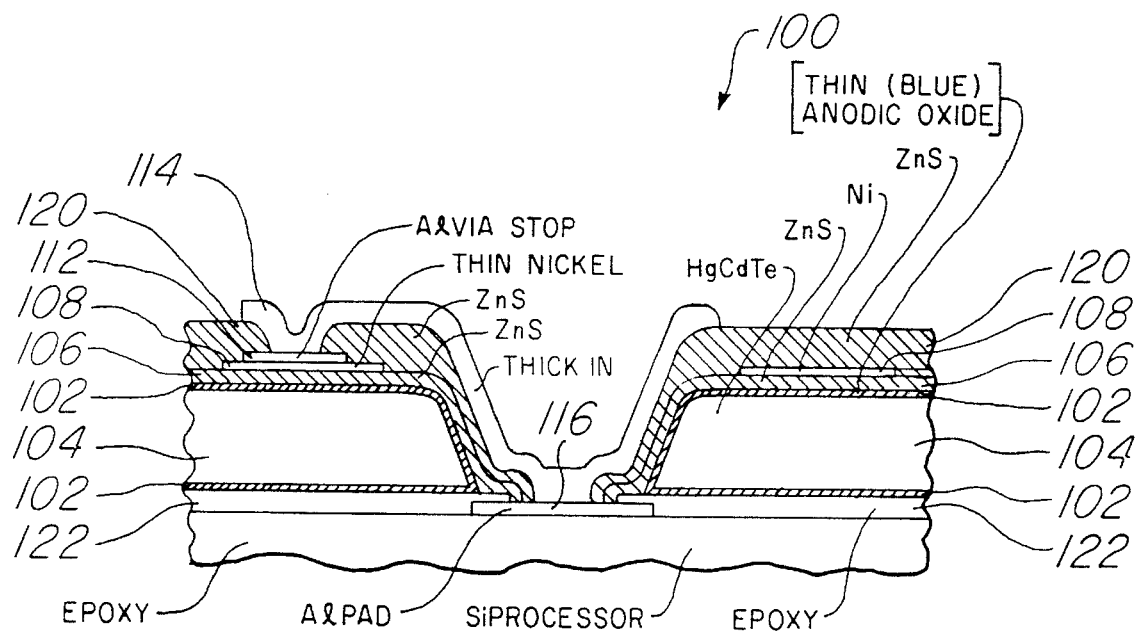
FIGS. 1a–b are cross sectional elevation and plan views of a prior art infrared, photo capacitive detector.
Figure 1B:
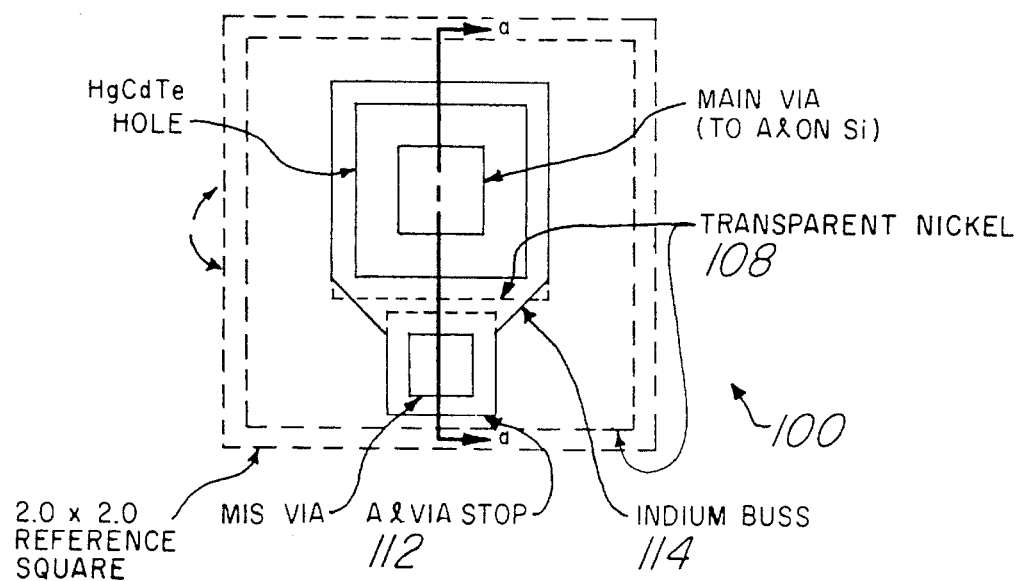

FIGS. 1a–b illustrate in cross sectional elevation and plan views a single pixel (denoted by reference numeral 100) of a prior art $Hg_{1-x}Cd_xTe$ photocapacitive infrared imager and show anodic oxide passivation 102 of $Hg_{1-x}Cd_xTe$ 104 together with ZnS gate dielectric 106 and nickel gate 108. FIG. 1a is a section taken along line a—a in FIG. 1b. The Figures also indicate the underlying silicon processor 110 for the imager, the metal connection (112-114-116) of gate 108 to silicon processor 110, ZnS insulation 120, and epoxy 122 axing the $Hg_{1-x}Cd_xTe$ to the silicon processor.

Figure 2:
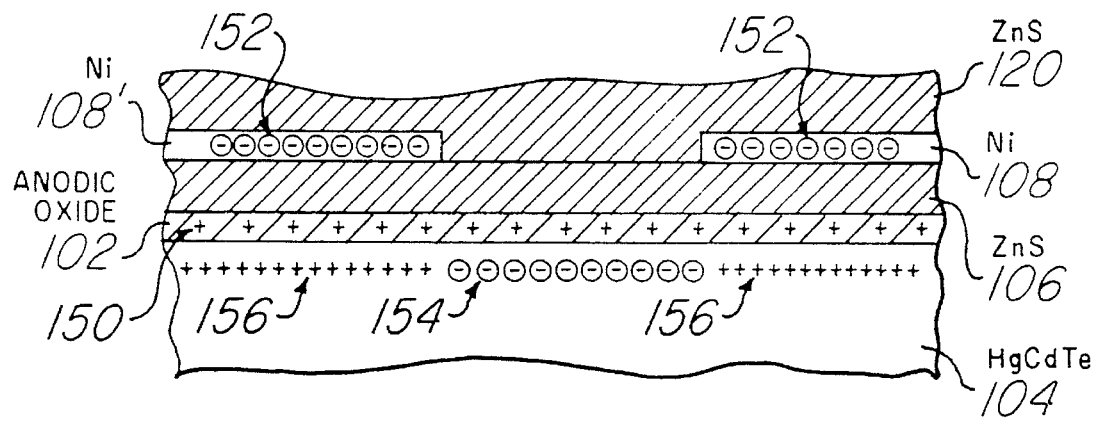
FIG. 2 shows the anodic oxide channel stop of the prior art detector.

FIG. 2 is an enlarged portion of the cross sectional elevation view as in FIG. 1a, but showing two adjacent gates, 108 and 108', of two adjacent pixels together with the accumulated channel stop between them. Anodic oxide 102 is about 700 Å thick, gate dielectric ZnS 106 is about 1500 Å thick, semitransparent nickel gates 108 and 108' are each about 70 Å thick and separated laterally by about 10 µm. Each pixel is about 50 µm square (including the channel stop). The fixed positive charge in anodic oxide 102 is heuristically indicated by the +'s 150, the negative bias on gates 108 and 108' by the ⊖'s 152, the accumulated electrons in $Hg_{1-x}Cd_xTe$ 104 forming the channel stop by ⊖'s 154, and the potential wells in the $Hg_{1-x}Cd_xTe$ under the gates by +'s 156. Without the fixed positive charge in anodic oxide 102, the surface region of $Hg_{1-x}Cd_xTe$ 104 between the gates 108 and 108' would be neutral or slightly depleted, and minority carrier holes in $Hg_{1-x}Cd_xTe$ 104 which are stored in the potential well created by the bias on gate 108 could diffuse along the surface to the potential well created by the bias on gate 108', and vice versa, and thereby disrupt the infrared detection.

Figure 3:
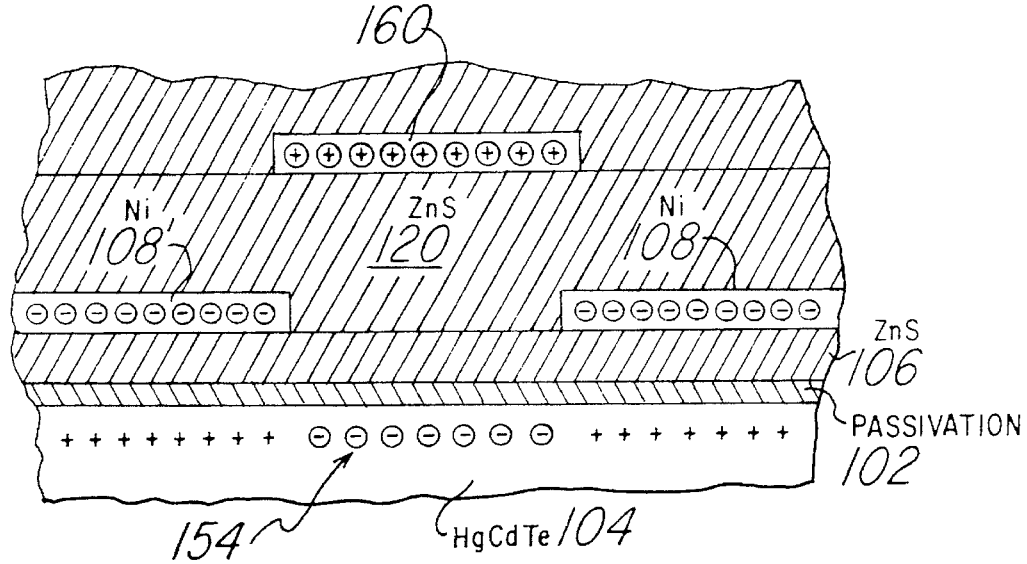
FIG. 3 shows a prior art field plate channel stop.

FIG. 3 is analogous to FIG. 2 but shows a prior art field plate channel stop; the elements in FIG. 3 are numbered the same as their analogs in FIG. 2. The field plate 160 is biased relative to $Hg_{1-x}Cd_xTe$ 104 to accumulate electrons to form the channel stop indicated by the ⊖'s 154. Field plate 160 is typically opaque and made of thick metal. Both gate insulator 106 and interlevel insulator 120 are made of ZnS, semitransparent gates 108 and 108' are 70 Å thick nickel, and $Hg_{1-x}Cd_xTe$ 104 may have a sulfide passivation.

Figure 4A:
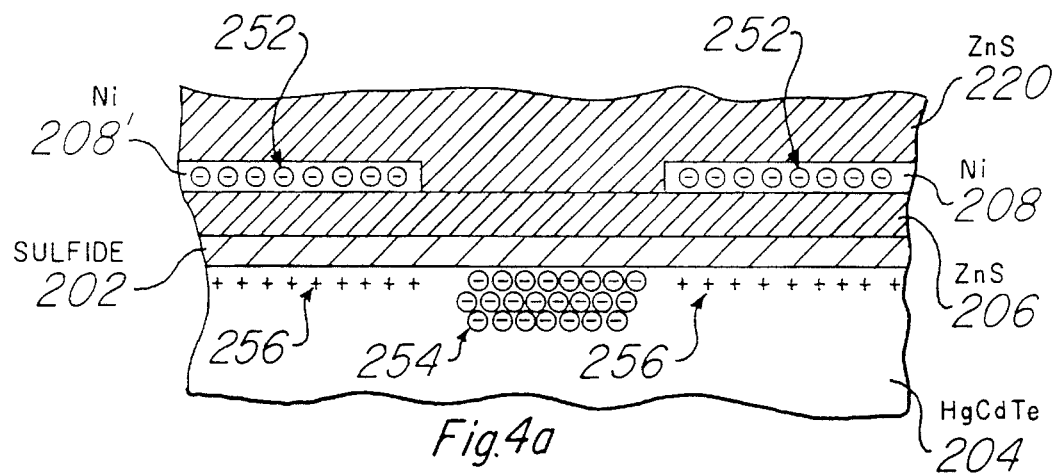
FIGS. 4a–c (illustrate a lattice damage channel stop and the steps of a method of fabrication.

The lattice damage channel stop is illustrated in FIG. 4a (a view analogous to that of FIGS. 2 and 3) which shows n type $Hg_{1-x}Cd_xTe$ 204 with passivation sulfide 202 (typical thickness 50–100 Å), ZnS dielectric 206 of thickness 1500 Å, semitransparent nickel gates 208 and 208' of thickness 70 Å which are laterally separated by about 10 μm, and insulation ZnS 220. Again, the negative bias on gates 208 and 208' is heuristically indicated by ⊖'s 252, the induced potential wells in $Hg_{1-x}Cd_xTe$ 204 by +'s 256, and boron implanted into $Hg_{1-x}Cd_xTe$ 204 between gates 208 and 208' by ⊖'s 254. The sulfide passivation 202 fails to provide a fixed positive charge to accumulate the surface of $Hg_{1-x}Cd_xTe$ 204 between gates 208 and 208'. However, the implanted boron converts $Hg_{1-x}Cd_xTe$ 204 to n+ (suggested by the ⊖'s 254) which possesses a higher threshold voltage for surface inversion (but still has the same flatband voltage) and hence provides a channel stop between the potential wells.

Figure 4B:
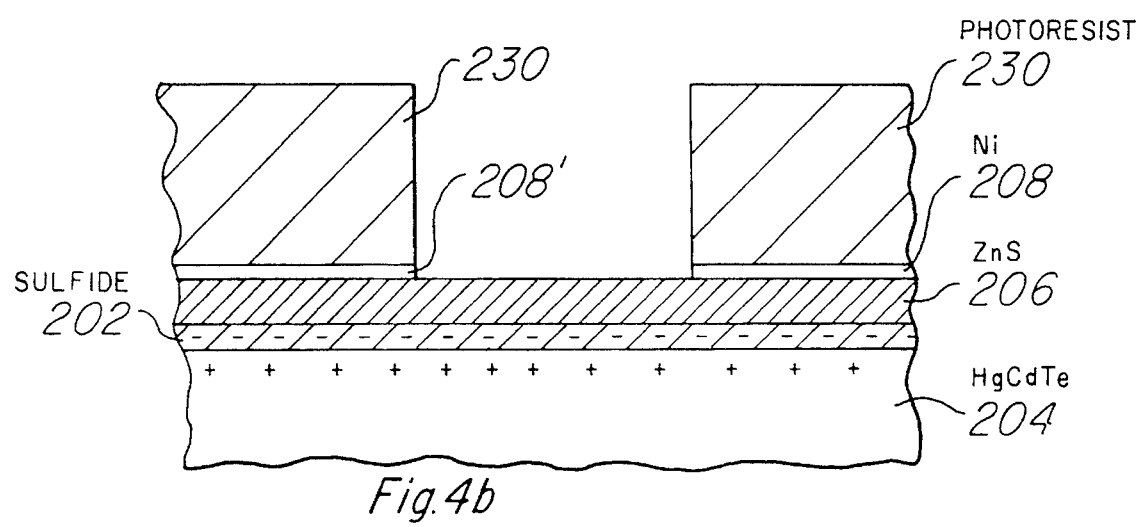
Figure 4C:
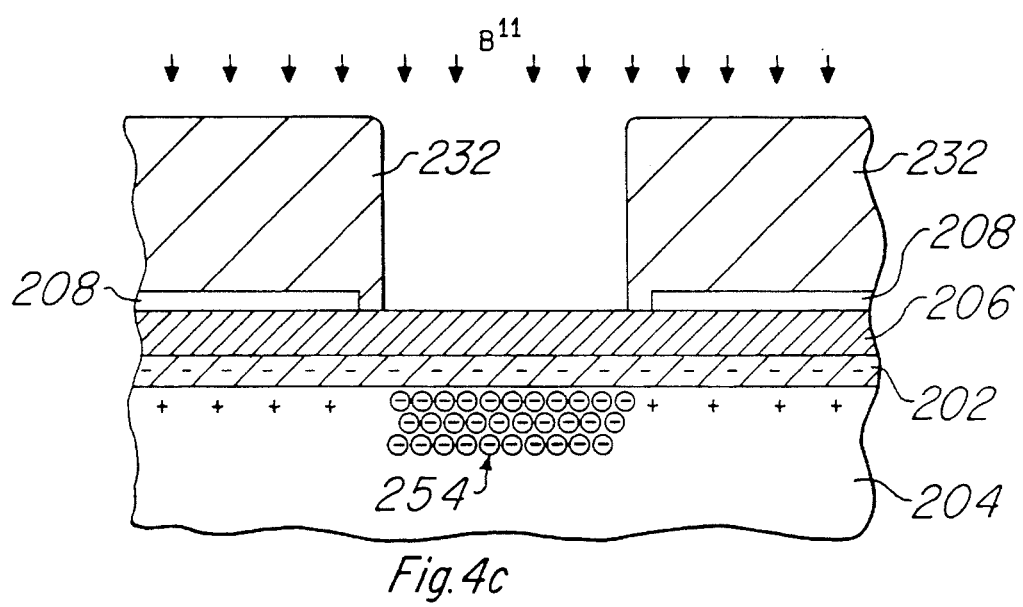

FIGS. 4b–c illustrate the following steps in a method of fabrication of the channel stops (and imagers).

(a) Begin with sulfide passivated substrate 204 of n type $Hg_{0.8}Cd_{0.2}Te$ with a carrier concentration of about $10^{15}$/ cm³ at 77K; substrate 204 may already be epoxied to a silicon processor and have vias for fabrication of a hybrid imager. Sulfide passivation layer 202 may have been formed by any convenient method such as anodic sulfidization or plasma sulfidization, and has a composition of primarily CdS with some HgS, depending upon the method of formation used. Next deposit 1500 Å of ZnS 206 gate dielectric by any convenient method. Deposit by evaporation a nickel layer of thickness about 70 Å. Spin on photoresist 230, and expose it to define the locations for the gates of the imager. Develop photoresist 230, and use it as an etch mask to etch the nickel layer to form the gates; gates 208 and 208' are shown in FIG. 4b. Sulfide 202 may have a small, negative fixed charge, and the $Hg_{0.8}Cd_{0.2}Te$ at the interface of sulfide 202 and substrate 204 may be depleted or even possibly inverted. This is suggested by the +s and −'s.

(b) Strip photoresist 230 and spin on photoresist 232; expose photoresist 232 to define the channel stops. Implant boron (isotope 11) at 75 KeV and a dose of $10^{13}$ ions/cm². The boron has a projected range of about 2000 Å, and penetrates ZnS 206 and sulfide 202 with the peak boron concentration about at about 300 Å below the interface of sulfide 202 and substrate 204. The projected straggle of the implant is about 800 Å, so at least 1100 Å of $Hg_{1-x}Cd_xTe$ 204 at the interface is heavily implanted and consequently doped n+ with a carrier concentration on the order of about $10^{17}$/ cm³ near the surface and at 77K. See FIG. 4c which indicates the boron implant caused doping with (⊖'s 254. Note that photoresist 230 could not have been used for the boron implant because the channel stop then would have extended (due to lateral straggle) under the gates 208 and 208' and degraded performance. Photoresist 232 extends about 2.5 μm beyond gates 208 and 208' to provide an offset between channel stop 254 and depletion regions under the gates.

(c) Strip photoresist 232 and deposit ZnS insulation layer 220 of thickness 3000 Å. Use photoresist to etch openings in ZnS 220 to the gates and to the underlying silicon processor. Deposit metal and pattern it with photoresist and etch it to form the connections from the gates to the silicon processor. This completes the imager.

Figure 5A:
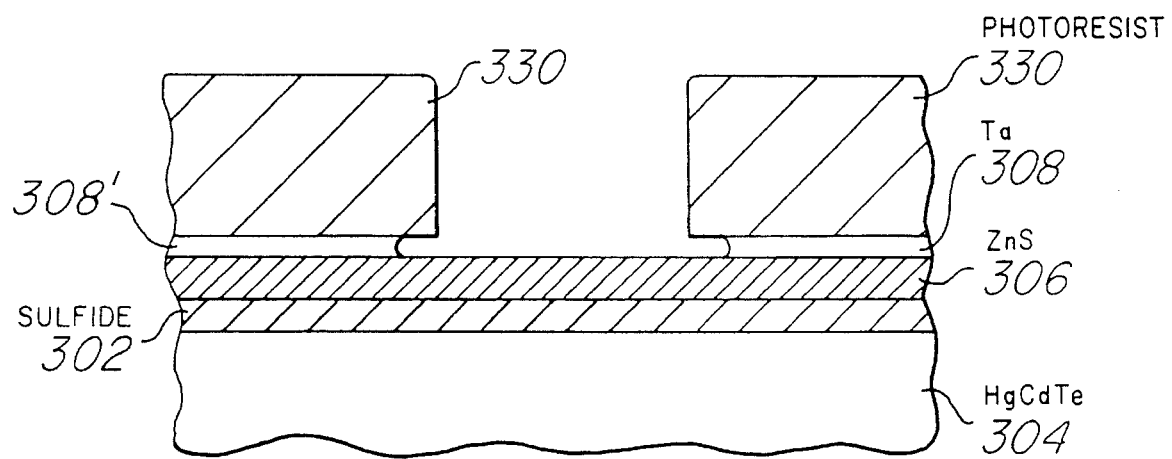
FIGS. 5a–b show steps in a first preferred embodiment method of lattice damage channel stop.
Figure 5B:
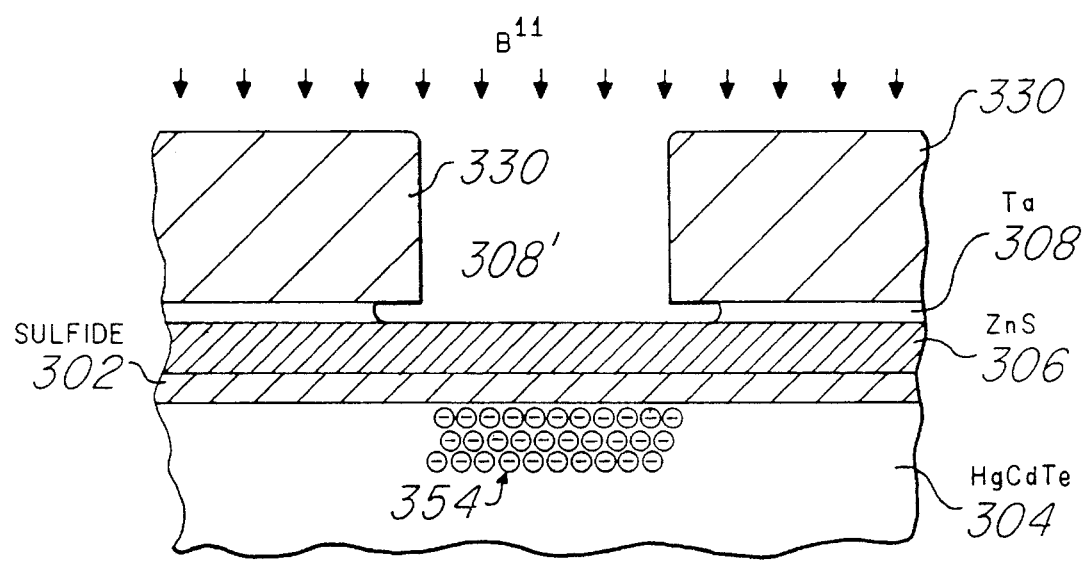

First preferred embodiment method of fabrication of the first preferred embodiment channel stops (and imagers) includes the following steps which are illustrated in FIGS. 5a–b:

(a) Begin with sulfide passivated substrate 304 of n type $Hg_{0.8}Cd_{0.2}Te$; sulfide passivation layer 302 has a composition (primarily CdS with some HgS) and fixed charge (from essentially zero to negative about $2\times10^{11}$/cm²) depending upon the method of formation used. Next deposit 1500 Å of ZnS 306 gate dielectric by any convenient method. Deposit by sputtering a tantalum (or other refractory metal) layer of thickness about 1000 Å. Spin on photoresist 330, and expose it to define the locations for the gates of the imager. Develop photoresist 330, and use it as an etch mask to plasma etch the tantalum layer with $CF_4$ to form the gates. This etch is isotropic and undercuts the tantalum as illustrated in FIG. 5a; overetching by 1500% yields an undercut of about 1.0–1.5 μm. The selectivity of the etch for tantalum relative to ZnS 306 is about 200 to 1; but even if a few hundred Å of ZnS 306 are removed during the overetch, the subsequent deposition of ZnS 320 will compensate for the loss. See FIG. 5a showing gates 308 and 308'.

(b) Implant boron (isotope 11) at 75 KeV and a dose of $10^{13}$ ions/cm² using photoresist 330 as the implant mask. The boron has a projected range of about 2000 Å, and penetrates ZnS 306 and sulfide 302 with the peak boron concentration about at about 300 Å below the interface of sulfide 302 and substrate 304. The projected straggle of the implant is about 800 Å, so at least 1100 Å of $Hg_{1-x}Cd_xTe$ 304 at the interface is heavily implanted and consequently doped n+. Experimental results indicated that the lateral damage is about 1.0 μm as C-V characteristic similar to that of low frequency occurred at <1.0 μm of overhang. Thus a 1.5 μm overhang of photoresist 330 on gates 308 and 308' is sufficient to prevent the implant from extending under the gates and to produce channel stop effects. See FIG. 5b which indicates the boron implant caused doping with ⊖'s 354. Note that with only a 0.5 μm overhang by photoresist 330 this implant schedule would not yield an effective channel stop.

(c) Strip photoresist 330 and deposit ZnS insulation layer 320 and complete the imager as previously described.

The first preferred embodiment imager is similar to the prior art imager with pixels illustrated in FIGS. 1a–b, but with sulfide passivation and first preferred embodiment channel stops.

Figure 6:
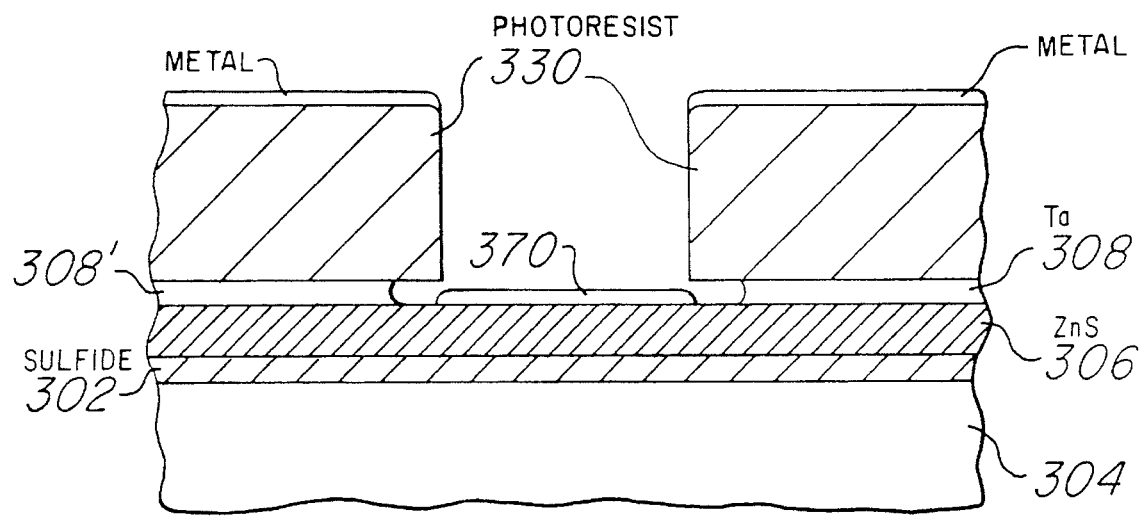
FIG. 6 shows a first preferred embodiment field plate.
Figure 6A:
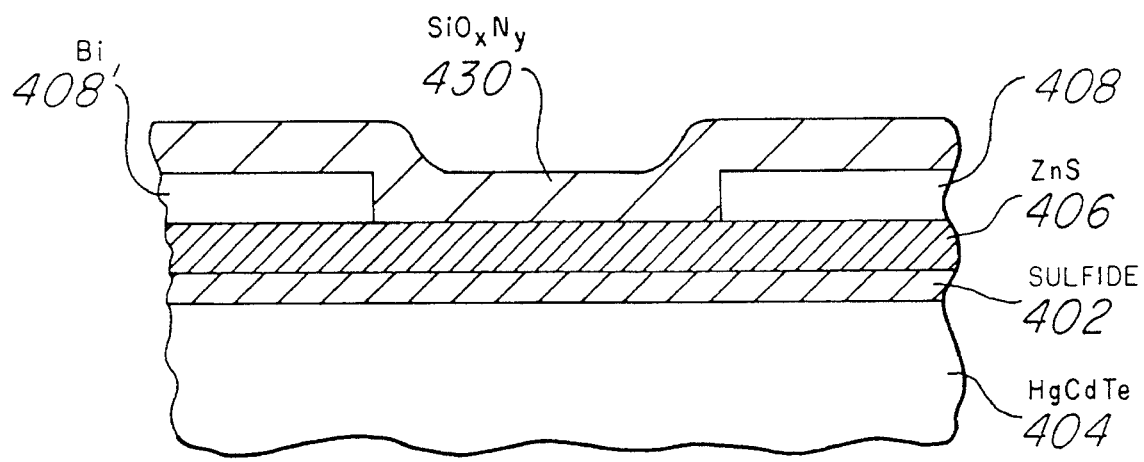
Figure 6B:
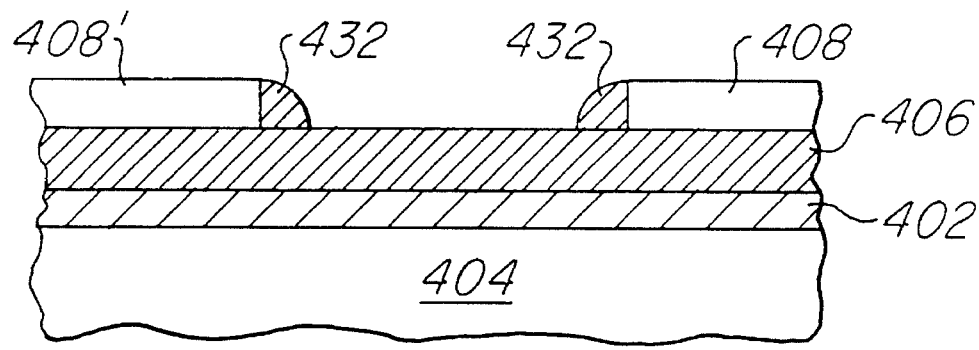
Figure 6C:
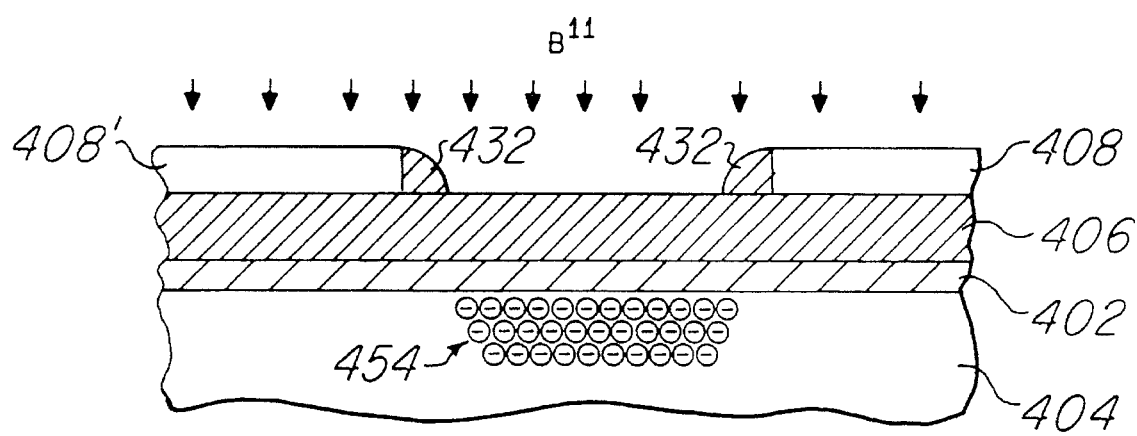

Note that the same undercut etch of the gate level metal can be used to form a self-aligned field plate or guard ring:

in place of the implant of boron in step (b) a deposition of gate metal (see FIG. 6) followed by liftoff of the photoresist will yield a field plate 370 aligned to the gates 308 and 308'. The separation between gate 308 and field plate or guard ring 370 is controlled by the amount of undercut during the etch of the gate level metal. Because there is no implant, the separation between gate 308 and field plate 370 will not be limited by implant lateral straggle.

Figure 7:
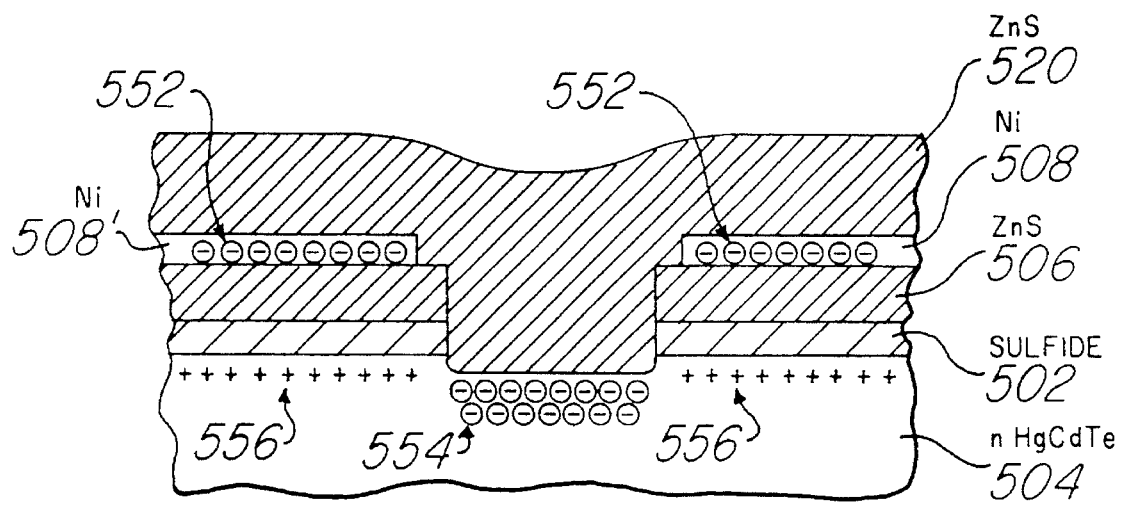
FIG. 7 illustrates the effect of a preferred embodiment field plate.

A measure of the effectiveness of field plate 370 as a channel stop source for a 0.5 μm separation between gate 308 and field plate 370 is shown in FIG. 7 which graphs the MIS diode semiconductor resistance ($R_oA$) as a function of the bias applied to the field plate. That is, the MIS diode formed by gate 308, insulator 302–306, and semiconductor 304 is modelled as a capacitor $C_i$ in series with a parallel capacitor $C_p$ and resistance $R_oA$ where $C_i$ represents the insulator capacitance and the parallel $C_p$ and $R_oA$ represent the semiconductor. The capacitances and resistance measured depend upon the gate bias and the frequency of the signal applied across the MIS diode due to factors such as recombination rates. An increase in $R_oA$ typically indicates a lessening of currents that are generated within $Hg_{1-x}Cd_xTe$ 304 laterally away from gate 308 and propagate along the interface of $Hg_{1-x}Cd_xTe$ 304 with sulfide 302 to under gate 308. As FIG. 7 illustrates, once the field plate 370 bias is greater than about −1 volt a channel stop has been induced that deters these interface currents and increases $R_oA$.

Figure 8A:
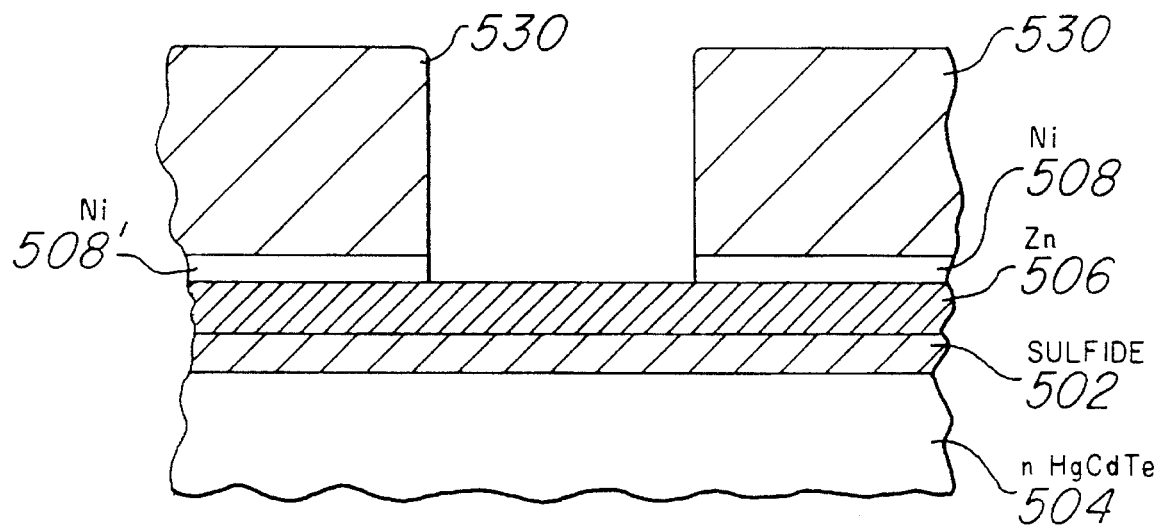

Second preferred embodiment method of fabrication of the preferred embodiment channel stops (and imagers) includes the following steps illustrated in cross sectional elevation view:

(a) Begin with sulfide passivated substrate 404 of n type $Hg_{0.8}Cd_{0.2}Te$; sulfide passivation layer 402 has a composition (primarily CdS with some HgS) and fixed charge (from essentially zero to negative about $2 \times 10^{11}/cm^2$) depending upon the method of formation used. Next deposit 1000 Å of ZnS 406 gate dielectric by any convenient method. Deposit a conductive layer of thickness about 5000 Å. Spin on photoresist and expose it to define the locations for the gates of the imager. Develop the photoresist and use it as an etch mask to plasma etch the conductive layer to form the gates. Deposit conformal layer 430 of silicon dioxide or silicon nitride (or silicon oxynitride) of thickness about 10,000–15,000 Å; see FIG. 8a showing gates 408 and 408'.

Figure 8B:
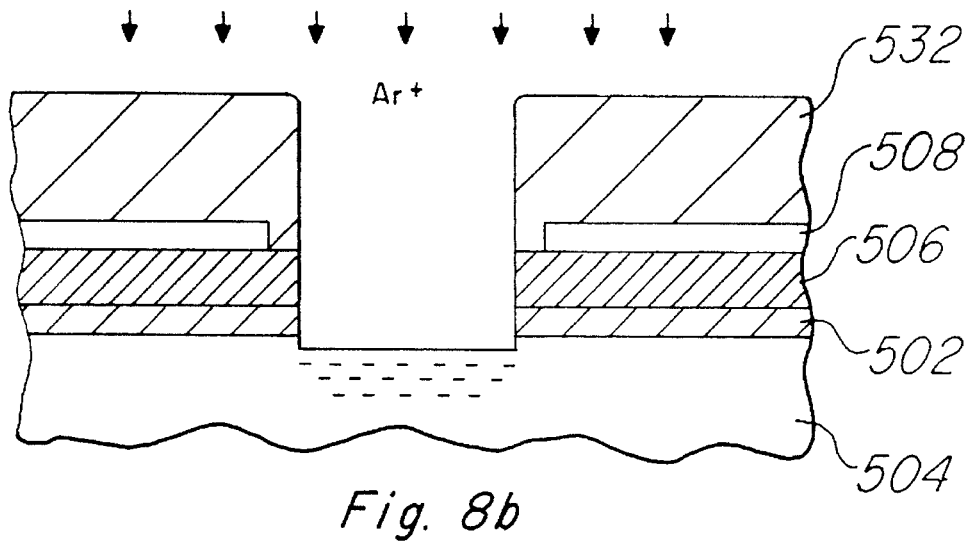
Figure 9:
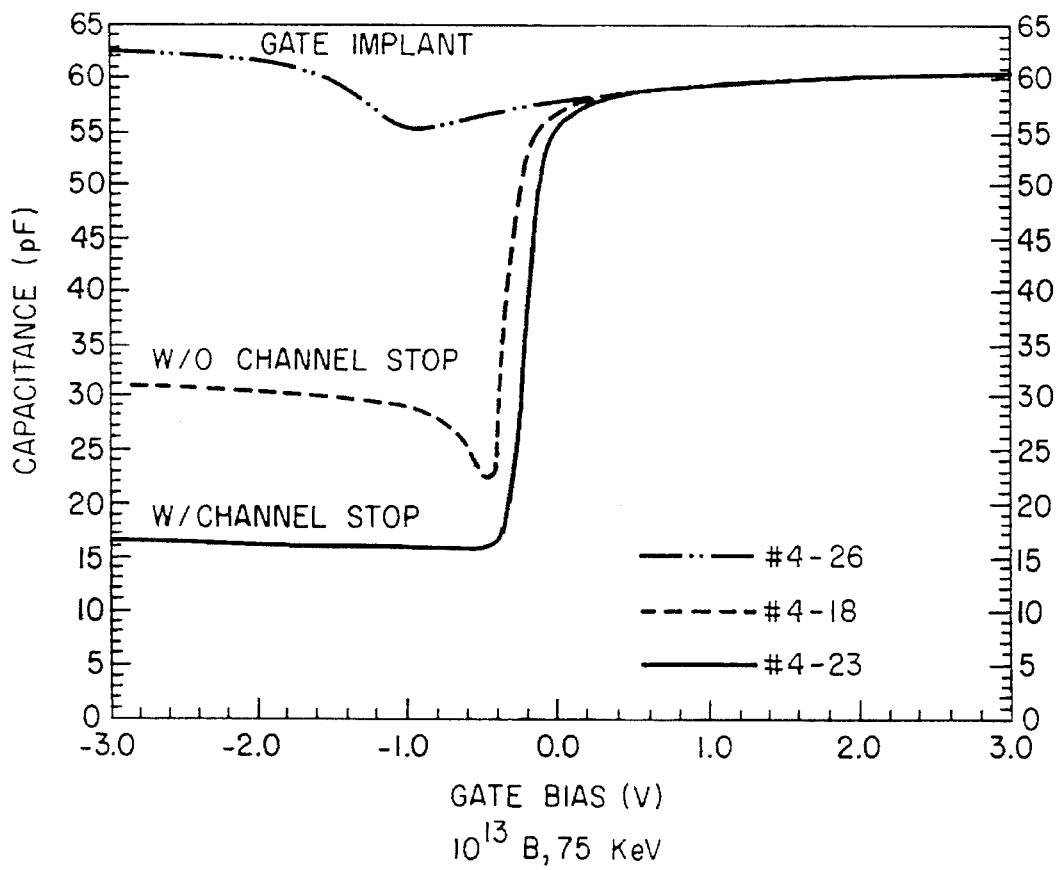

(b) Anisotropically etch layer 430 to leave sidewall filaments 432 on the edges of the gates. See FIG. 8b; the sidewall filaments are about 10,000–15,000 Å wide.

(c) Implant boron at 50 KeV and a dose of $10^{13}$ ions/cm² using the gates plus sidewall filaments as the implant mask. This is analogous to the sidewall oxide spacer approach to source/drain implantation in MOSFET fabrication. The boron has a projected range of about 1500 Å, and penetrates ZnS 406 and sulfide 402 with the peak boron concentration about at about 300 Å below the interface of sulfide 402 and substrate 404. The projected straggle of the implant is about 600 Å, so at least 900 Å of $Hg_{1-x}Cd_xTe$ 404 at the interface is heavily implanted and consequently doped n+. The lateral straggle is somewhat less than the projected straggle, so the 10,000 Å width of sidewall filaments 432 on gates 408 and 408' is sufficient to prevent the implant from extending under the gates. See FIG. 8c which indicates the boron-implant-caused doping with ⊖'s 454. Note that gate 408 must be thick enough to prevent the implant from penetrating the gate plus ZnS and doping the $Hg_{1-x}Cd_xTe$ beneath the gate. However, a thick gate absorbs a greater fraction of the incident infrared radiation, so a thinning of gate 408 by a timed etch may be used after the implant.

(d) Deposit ZnS insulation layer 420 and complete the imager as previously described.

An alternative self-aligned channel stop by lattice damage doping of $Hg_{1-x}Cd_xTe$ may be created by using ion milling of the insulator and passivation layers with mask being either the undercut photoresist 330 of the first preferred embodiment (FIG. 5b would have the boron ions replaced by argon ions that sputter away ZnS 306 and sulfide 302 and lattice damage dope $Hg_{1-x}Cd_xTe$ 304) or the unthinned gate 408 plus sidewall filaments 432 of the second preferred embodiment (FIG. 8c would have the boron ions replaced by argon ions that sputter away ZnS 406 and sulfide 402 and lattice damage dope $Hg_{1-x}Cd_xTe$ 404). Of course, photoresist 330 and unthinned gate 408 plus sidewall filaments 432 are also sputtered and must be of sufficient thickness to survive.

MODIFICATIONS AND ADVANTAGES

Various modifications of the preferred embodiment devices and methods may be made while retaining the features of self-aligned lattice damage channel stops and field plates or guard rings.

For example, the dimensions and shapes of the detectors may be varied, the material may be HgCdZnTe, HgMnZnTeSe, or other II–VI narrow bandgap semiconductors, the insulator such as ZnS may be formed directly on the semiconductor without a separate passivation layer, the implanted species or ion milling species may be any convenient ion, although light ions such as boron have a greater projected range for the same energy, and the gate and field plate or guard ring may be made of any convenient materials. The overhang can vary depending upon the amount of lateral straggle damage or the field plate bias relative to gate bias.

The invention provides the advantages of simple and process-compatible channel stops and field plates aligned to gates for high packing density.

What is claimed is:

1. A method of processing at least one semiconductor device, comprising the steps of:

forming a gate layer on an insulated semiconductor layer;

patterning resist on said gate layer;

forming gates from said gate layer by removal of portions of said gate layer using said resist as a mask; and forming a channel stop by implanting ions using said resist as a mask.

2. The method of claim 1, wherein:

(a) said removal is by plasma overetching.

3. A method of forming channel stops between semiconductor devices, comprising the steps of:

providing an n-type mercury cadmium telluride semiconductor layer with two devices formed therein, each of said devices including a gate element with a sidewall insulator formed thereon; and damaging a lattice within a region of said semiconductor layer between said two devices, said damaging by implanting ions into said layer.

4. The method of claim 3 wherein said step of implanting ions comprises implanting boron ions.

5. The method of claim 3 wherein said ions are implanted through at least one insulation layer on said semiconductor layer.

6. A method of processing semiconductor devices, said method comprising the steps of:

forming a gate layer on an insulated semiconductor layer;

patterning resist on said gate layer;

forming gates from said gate layer by removal of portions of said gate layer using said resist as a mask; and depositing a conductive material on said semiconductor layer using said resist as a mask.

7. The method of claim 6 wherein said removal is by plasma overetching.

8. The method of claim 6 wherein said step of depositing a conductive material comprises a step of forming a field plate.

9. The method of claim 6 wherein said step of depositing a conductive material comprises a step of forming a guard ring.

10. The method of claim 1 wherein said semiconductor, layer comprises a mercury cadmium telluride layer.

11. A method of processing at least one semiconductor device, comprising the step of:

damaging a lattice of an n-type mercury cadmium telluride semiconductor layer in a region between gates of two devices formed in said layer, said damaging by implanting boron ions into said semiconductor layer such that said damaged region is offset from said devices.

12. The method of claim 11, wherein each of said two devices includes a gate layer and wherein a mask is used for both overetching of said gate layer to form said devices and said implanting ions.

13. The method of claim 11 wherein said boron is implanted through at least one insulation layer on said semiconductor layer.

14. The method of claim 3 wherein said sidewall insulator is selected from the group consisting of silicon dioxide, silicon nitride, and silicon oxynitride.

* * * * *